(12) United States Patent
Bohnenkamp et al.

(10) Patent No.: US 7,183,758 B2
(45) Date of Patent: Feb. 27, 2007

(54) AUTOMATIC EXCHANGE OF DEGRADERS IN ACCELERATED TESTING OF COMPUTER CHIPS

(75) Inventors: Carl E. Bohnenkamp, Hopewell Junction, NY (US); Ethan H. Cannon, Essex Junction, VT (US); Ethan W. Cascio, Cambridge, MA (US); Michael S. Gordon, Somers, NY (US); Kenneth P. Rodbell, Sandy Hook, CT (US); Theodore H. Zabel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/734,694

(22) Filed: Dec. 12, 2003

(65) Prior Publication Data

US 2005/0143945 A1    Jun. 30, 2005

(51) Int. Cl.
*G01R 31/28* (2006.01)
(52) U.S. Cl. .................... 324/158.1; 209/573
(58) Field of Classification Search ............. 324/158.1; 209/571–575
See application file for complete search history.

(56) References Cited

U.S. PATENT DOCUMENTS

| | | | | |
|---|---|---|---|---|
| 5,584,395 A | * | 12/1996 | Homma | 209/571 |
| 5,850,145 A | * | 12/1998 | Burroughs et al. | 324/751 |
| 6,433,336 B1 | * | 8/2002 | Jongen et al. | 250/305 |
| 6,621,261 B2 | * | 9/2003 | Tsuchiya | 324/158.1 |
| 2005/0134256 A1 | * | 6/2005 | Cheng et al. | 324/158.1 |

* cited by examiner

*Primary Examiner*—Jermele Hollington
*Assistant Examiner*—Arleen M. Vazquez
(74) *Attorney, Agent, or Firm*—Ference & Associates

(57) ABSTRACT

Issues that are addressed in accordance with at least one presently preferred embodiment of the present invention, are: improvements upon the time it takes to physically swap degraders (done previously by hand); the safety involved in doing so, since the degraders become highly radioactive; possible improved energy resolution and beam stability if the accelerator can be left running continuously; and in-situ monitoring of beam current, beam position and stability. Particularly contemplated are methods and arrangements for changing degraders automatically, not manually, and in a safe manner.

19 Claims, 3 Drawing Sheets

AUTOMATIC EXCHANGE OF DEGRADERS IN ACCELERATED TESTING OF COMPUTER CHIPS

FIELD OF THE INVENTION

The present invention relates generally to degraders used in the accelerated testing of computer chips and to methods and arrangements for setting up and exchanging the same.

BACKGROUND OF THE INVENTION

Accelerated testing of computer chips for "soft" fails can be accomplished by exposing the chips to a beam of protons, neutrons, or other ions. The high energy protons and neutrons can cause a "spallation" reaction to occur when they collide with nuclei in the chip, for example copper, oxygen, or silicon. (See Henry H. K. Tang, and Kenneth P. Rodbell, MRS Bulletin, Volume 28, No. 2, February 2003, 111.) This primary reaction then causes the release of heavily-ionizing particles which may hit a sensitive region and cause a soft fail. Alternatively, if the heavy ions can deposit enough charge, they can cause a fail as well. A tester is connected to the chip and can load specific patterns onto, and then read the pattern from, the chip after the exposure to the external beams. (See J. F. Ziegler, H. P. Muhlfeld, C. J. Montrose, H. W. Curtis, T. J. O'Gorman, and J. M. Ross, IBM Journal of Research and Development, Vol. 40 No. 1 Jan. 1996 (51).)

Most cosmic rays near the earth's surface include neutrons, and at higher elevations, a mixture of neutrons, protons, muons and pions. (See J. F. Ziegler, IBM Journal or Research and Development, Vol. 40 No. 1 Jan. 1996 (19).) It is believed that the soft error rate (SER) for chips caused by cosmic ray neutrons in the ~50 MeV and above energy range is nearly the same as that caused by protons at the same energy. (See Joint Electron Device Engineering Council, (JEDEC) Standard JESD89, Measurement and Reporting of Alpha Particle and Terrestrial Cosmic Ray-Induced Soft Errors in Semiconductor Devices.) Since proton beams are more readily available than neutron beams at high energy, chip manufacturers and vendors generally perform the high-energy portion of the cosmic-component of accelerated SER testing using proton beams. It is desirable to perform neutron-induced SER tests at low energy (~14 MeV) since the proton and neutron-induced SER may differ at these low energies.

Several laboratories that have SER programs for proton and neutron testing are listed in annex D of JEDEC, supra.

The overall soft error rate caused by terrestrial cosmic rays is found by integrating the product of the empirically-determined SER cross section (measured at several energies) and the cosmic ray neutron flux, over energy. (See JEDEC, supra.) The accelerators used to generate the proton beams are generally cyclotrons or linear accelerators with somewhat complicated beam transport systems. It has generally been found to be time consuming to reduce the energy of these beams since many ion-optical lenses and steering magnets need to be retuned. Beam energies are lowered by inserting a "degrader" into the path of the proton beam. (See Ziegler and Muhlfeld et al., supra.) The primary beam loses energy and spreads out laterally as it traverses through a block of Plexiglas or Lucite. This degraded beam impinges on the computer chip at lower energy than the primary beam, with a larger energy spread and larger lateral dimensions.

Heretofore, the degraders have been changed by hand. To avoid personal exposure to severe radiation, the beam of protons has been either interrupted upstream of the degraders by insertion of a beam stop or Faraday cup, or the accelerator has been turned off, and the degraders were swapped by hand. The degraders, themselves, become radioactive, emitting $\beta$'s and $\gamma$'s after being irradiated by the proton beam, thus presenting potential safety problems. Accordingly, a need has been recognized in connection with overcoming these problems, among others.

SUMMARY OF THE INVENTION

Issues that are addressed in accordance with at least one presently preferred embodiment of the present invention, are: improvements upon the time it takes to physically swap degraders (done previously by hand); the safety involved in doing so, since the degraders become highly radioactive; possible improved energy resolution and beam stability if the accelerator can be left running continuously; and in-situ monitoring of beam current, beam position and stability. Particularly contemplated are methods and arrangements for changing degraders automatically, not manually, and in a safe manner.

In summary, one aspect of the invention provides an apparatus for automatically exchanging components in soft-error testing of computer chips, the apparatus comprising: a main body adapted to hold a plurality of components; and an arrangement for automatically altering a configuration of the main body to move one of the components into a position formerly occupied by another of the components.

Additionally, one aspect of the invention provides a method of automatically exchanging components in soft-error testing of computer chips, the method comprising the steps of: providing a main body adapted to hold a plurality of components; and automatically altering a configuration of the main body to move one of the components into a position formerly occupied by another of the components.

Furthermore, another aspect of the invention provides a program storage device readable by machine, tangibly embodying a program of instructions executable by the machine to perform method steps for automatically exchanging components in soft-error testing of computer chips, the method comprising the steps of: providing a main body adapted to hold a plurality of components; and automatically altering a configuration of the main body to move one of the components into a position formerly occupied by another of the components.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

There is broadly contemplated in accordance with at least one presently preferred embodiment of the present invention an automated method for changing degraders, which can be operated remotely from the safety of a control room. Generally, unused positions on the rotary wheel could be used for, for example, a Faraday cup, beam position monitor, or beam intensity uniformity monitor. These could be put into the beam either before or after a chip is exposed to the degraded proton beam. Alternative embodiments might include the use of another rotary wheel, downstream of the beam degraders, which could include beam collimators to reduce the effects of the large-angle scattered beam from irradiating the area surrounding the chip under test. A Faraday cup, beam position monitor, or beam intensity uniformity monitor could be installed on a third rotary wheel (degrader, collimator on the first and second wheel) so that the beam current, position or uniformity could be determined after beam collimation. Finally, another embodiment could include installing the devices under tests (DUT) on yet another, or forth rotary wheel. These DUT could be rotated into the beam. This improves operator safety further since the copper in most state-of-the-art computer chips becomes highly radioactive, with long half-lives for β-emission, after high-energy proton irradiation.

Figure 1:
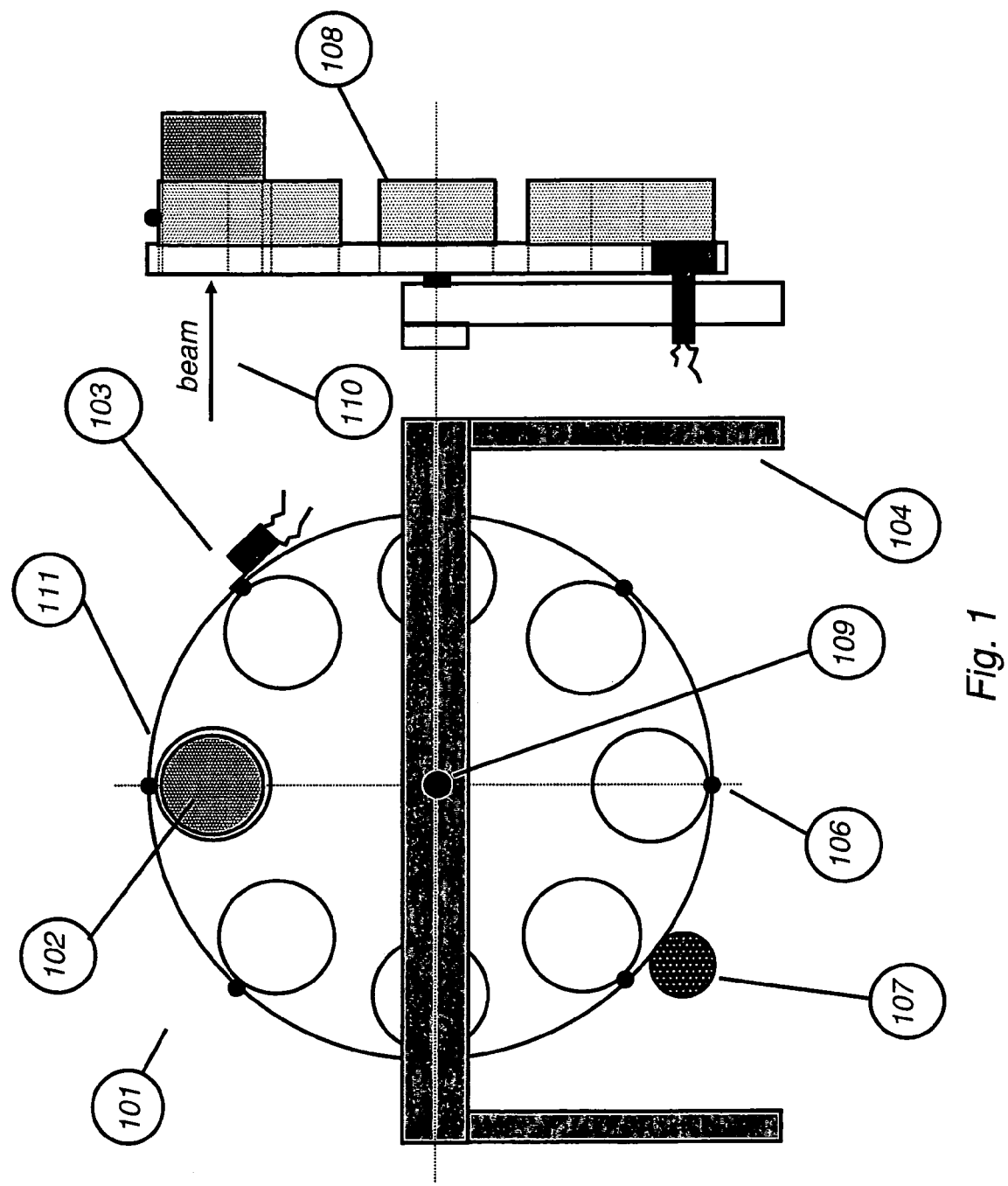
FIG. 1 is an elevational view of a degrader exchanging arrangement.

FIG. 1 illustrates, in accordance with an embodiment of the present invention, a rotary degrader assembly 101 that includes a rotating disk 111. A proton beam 110 will emerge in air through a hole in the wall upstream of assembly 101. A degrader 102 is shown installed in a topmost hole of rotating disk 111. Those skilled in the art will recognize that other holes could be filled with degraders of various sizes and shapes to lower the beam's energy and/or change its lateral dimensions. Also shown are a rotary degrader stand, 104, as well as an axle and bearing 109 about which disk 111 is rotatable.

Preferably, a degrader 102 will be insertable into essentially any of several thin-walled cylinders 108 disposed about a circumference of disk 111, and can be held in place by a friction fit if a tight fit is justified, or alternatively with an appropriate clamping device. Disk 111 can preferably be driven by a friction-type (direct-drive) motor 107 in intimate contact with the perimeter of disk 111. Indexing mechanisms 106 on the perimeter of the thin-walled cylinders 108 on disk 111 will preferably be disposed and arranged as to make contact with a microswitch 103 employed for helping indicate whether a degrader (or other component mounted in one of the cylinders 108) is "in place". The motor 107 preferably stops rotating the disk 111 when contact between the indexing mechanism 106 and the microswitch 103 is made; it preferably runs otherwise. Conceivably, by pressing a momentary switch which bypasses the microswitch 103, the disk 111 can be rotated and another degrader (or other component) put into position. A rotary switch could also be implemented and wired up so that the motor 107 would position the appropriate degrader (or other component) into a position selected by the switch.

Figure 2:
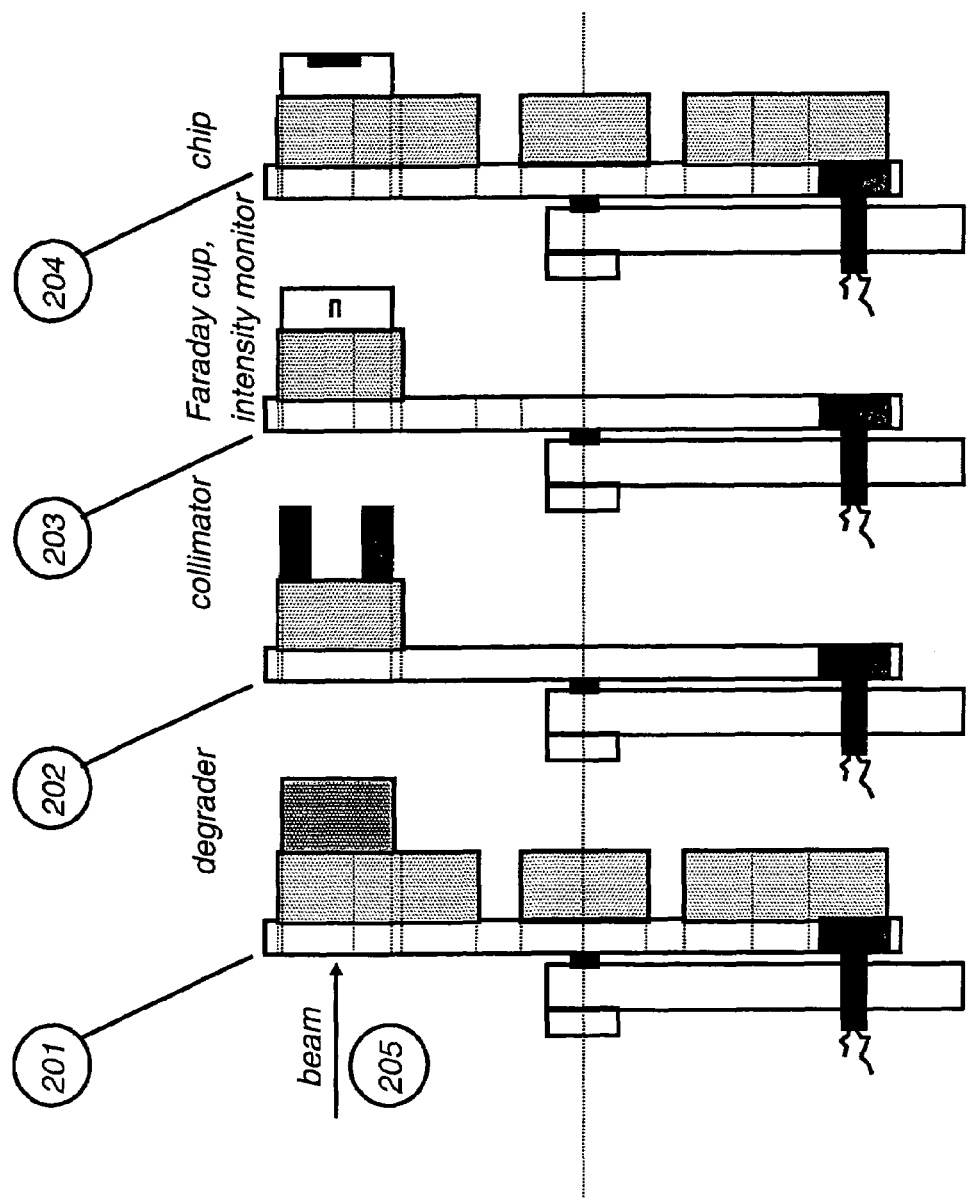
FIG. 2 is a side view of the arrangement shown in FIG. 1.
Figure 3:
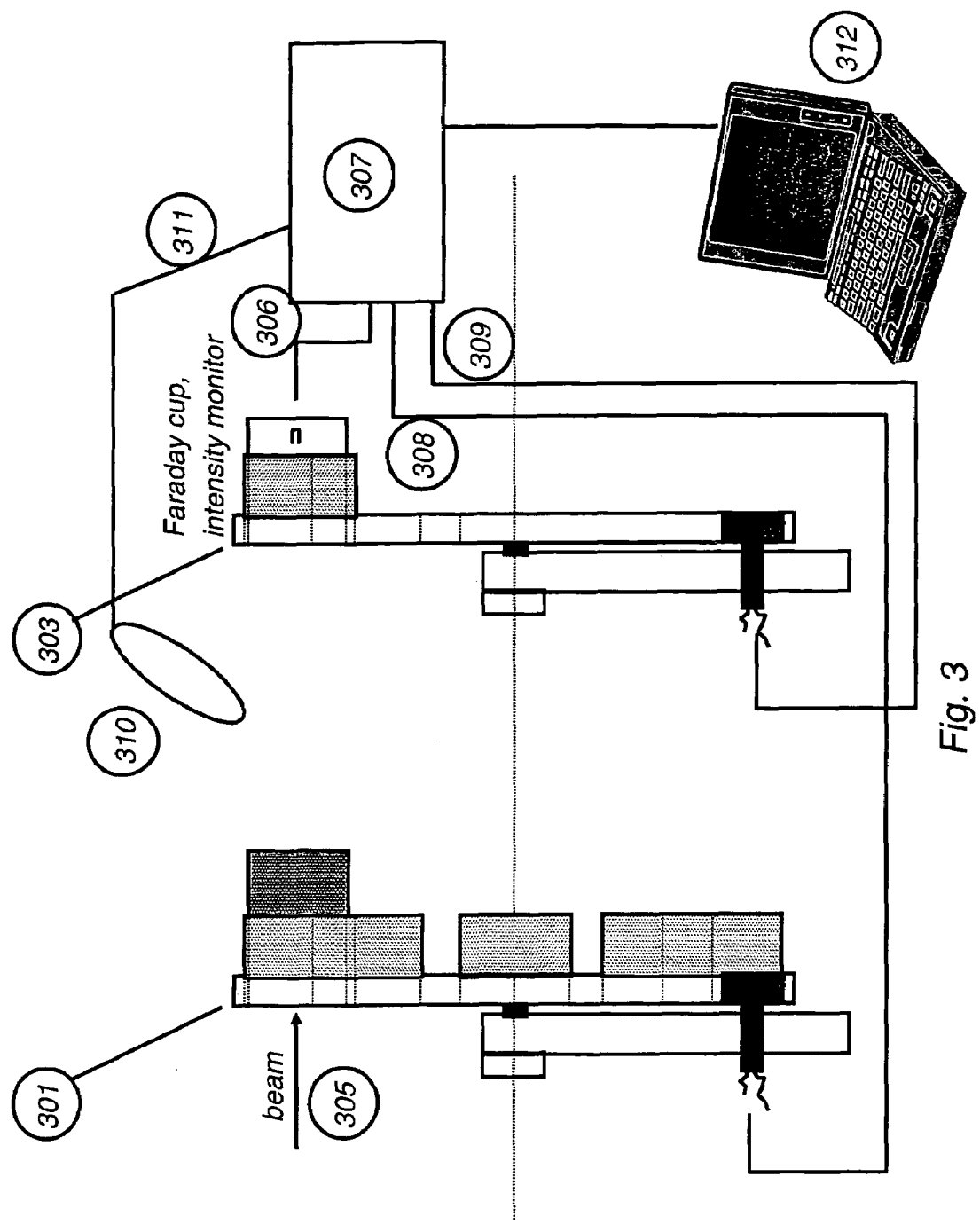
FIG. 3 is a schematic drawing of an implementation of computer control in accordance with the present invention.

Those skilled in the art will recognize that the operation of the rotary degraders, as well as other rotary devices (see FIG. 2), could be automated, along with the data collection and analysis by use of an appropriately-configured personal computer or workstation (see FIG. 3).

A Faraday cup, installed on disk 111, could conceivably be rotated into the proton beam, before and/or after the irradiation of a chip, so that periodic and direct measurement of the beam current could be made. Heretofore, the beam current has usually been measured carefully only at the beginning, or end of an experiment; however the chip under test had to be removed manually from the beam path and the Faraday cup inserted in its place, and the signal from an ionization chamber that the protons pass through is registered in real-time and calibrated with respect to the Faraday cup. Accordingly, real-time measurement, as can be accomplished in accordance with the embodiments of the present invention, would appear to present significant logistical advantages.

FIG. 2 shows a four-rotary wheel embodiment of this invention. The beam is made to impinge from the left (205) onto the first rotary wheel containing the degraders (201). The next wheel could include a series of collimators (202) used to reduce stray or scattered beam from activating surrounding materials. This wheel could have a series of collimators that could be rotated into the beam; the open area of the one chosen would be slightly larger than the sensitive area of the chip under test. The collimators preferably are made of a material and thickness to prevent activation, yet also to stop the stray, scattered beam. Positions in the third wheel (203) could contain beam diagnostics such as a Faraday cup, or a beam position and/or illumination uniformity monitor such as a scintillator as viewed by a CCD or TV camera. These devices could be rotated out of the way so that the collimated beam could pass, unobstructed, onto the devices under test, shown at 204 on the fourth rotary wheel. A preferred embodiment would include all devices under test connected to this wheel so that they could be rotated into the beam, one at a time, preferably under computer control.

FIG. 3 shows a preferred embodiment for computer control of the rotary wheels using computer or workstation 312 and tool controller 307. Tool controller 307 could preferably contain logic for controlling the friction drive motors 107, using logic or analog lines 307 and 309 shown in accordance with the first and third rotary wheels in FIG. 2, equipment for processing and amplifying the signals from a Faraday cup (in 303), or a camera or CCD signal from detector 310 using lines 306 or 311, respectively. An algorithm in the workstation 312 could be used to process the radial positions of each and every one of the wheels shown in FIG. 2 so that the proper degrader, collimator, diagnostic tool and chip would be in place before the beam stop is opened.

It is to be understood that the present invention, in accordance with at least one presently preferred embodiment, includes an arrangement for automatically altering a configuration of a main body adapted to hold a plurality of components, which may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. An apparatus for automatically exchanging components in soft-error testing of computer chips, said apparatus comprising:
    a main body adapted to hold a plurality of components;
    an arrangement for automatically altering a configuration of said main body to move one of the components into a position formerly occupied by another of the components; and at least one additional main body adapted to exchange components in soft-error testing of computer chips, wherein the components comprise beam degraders.

2. The apparatus according to claim 1, wherein:
said main body comprises a rotatable disk; and
said arrangement for automatically altering comprises an arrangement for rotating said main body.

3. The apparatus according to claim 2, wherein the components are for being disposed at different locations along a circumferential dimension of said main body.

4. The apparatus according to claim 1, wherein said main body comprises mounting media for mounting the beam degraders with respect to said main body in a manner permitting selective detachment of the beam degraders from said main body.

5. The apparatus according to claim 4, wherein at least one of said mounting media is adapted to accept a component other than a beam degrader.

6. The apparatus according to claim 5, wherein at least one of said mounting media is adapted to accept at least one of: a Faraday cup, a beam position monitor, and a beam intensity uniformity monitor.

7. The apparatus according to claim 1, wherein said at least one additional main body comprises an arrangement for positioning into the path of a beam a device-under-test.

8. The apparatus according to claim 1, wherein said at least one additional main body comprises an arrangement for positioning into the path of a beam at least one of: a beam collimator, a Faraday cup, a beam position monitor and a beam position intensity monitor.

9. The apparatus according to claim 1, further comprising an indexing arrangement to ensure precise positioning of the components.

10. A method of automatically exchanging components in soft-error testing of computer chips, said method comprising the steps of:
providing a main body adapted to hold a plurality of components;
automatically altering a configuration of the main body to move one of the components into a position formerly occupied by another of the components; and
providing at least one additional main body adapted to exchange components in soft-error testing of computer chips,
wherein the components comprise beam degraders.

11. The method according to claim 10, wherein:
the main body comprises a rotatable disk; and
said step of automatically altering comprises rotating the main body.

12. The method according to claim 11, further comprising the step of disposing the components at different locations along a circumferential dimension of the main body.

13. The method according to claim 10, wherein said step of providing a main body comprises providing mounting media for mounting the beam degraders with respect to the main body in a manner permitting selective detachment of the beam degraders from the main body.

14. The method according to claim 13, wherein at least one of the mounting media is adapted to accept a component other than a beam degrader.

15. The method according to claim 14, wherein at least one of the mounting media is adapted to accept at least one of: a Faraday cup, a beam position monitor, and a beam intensity uniformity monitor.

16. The method according to claim 10, wherein said step of providing at least one additional main body comprises providing an arrangement for positioning into the path of a beam a device-under-test.

17. The method according to claim 10, wherein said step of providing at least one additional main body comprises providing an arrangement for positioning into the path of a beam at least one of: a beam collimator, a Faraday cup, a beam position monitor and a beam position intensity monitor.

18. The method according to claim 10, further comprising the step of providing an indexing arrangement to ensure precise positioning of the components.

19. A program storage device readable by machine, tangibly embodying a program of instructions executable by the machine to perform method steps for automatically exchanging components in soft-error testing of computer chips, said method comprising the steps of:
providing a main body adapted to hold a plurality of components;
automatically altering a configuration of the main body to move one of the components into a position formerly occupied by another of the components; and
providing at least one additional main body adapted to exchange components in soft-error testing of computer chips,
wherein the components comprise beam degraders.

* * * * *